(12) United States Patent
Lin

(10) Patent No.: US 11,143,951 B2
(45) Date of Patent: Oct. 12, 2021

(54) PELLICLE FOR AN EUV LITHOGRAPHY MASK AND A METHOD OF MANUFACTURING THEREOF

(71) Applicant: TAIWAN SEMICONDUCTOR MANUFACTURING CO., LTD., Hsinchu (TW)

(72) Inventor: Yun-Yue Lin, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 81 days.

(21) Appl. No.: 16/266,577

(22) Filed: Feb. 4, 2019

(65) Prior Publication Data
US 2019/0332005 A1    Oct. 31, 2019

Related U.S. Application Data

(60) Provisional application No. 62/664,524, filed on Apr. 30, 2018.

(51) Int. Cl.
*G03F 1/62* (2012.01)
*G03F 7/20* (2006.01)

(52) U.S. Cl.
CPC ............ *G03F 1/62* (2013.01); *G03F 7/70033* (2013.01); *G03F 7/70983* (2013.01)

(58) Field of Classification Search
CPC .... G03F 7/70983; G03F 7/70033; G03F 1/62; G03F 1/64
See application file for complete search history.

(56) References Cited

U.S. PATENT DOCUMENTS

| | | |
|---|---|---|
| 8,796,666 B1 | 8/2014 | Huang et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 9,618,837 B2 | 4/2017 | Lu et al. |
| 9,869,928 B2 | 1/2018 | Huang et al. |
| 9,869,934 B2 | 1/2018 | Huang et al. |
| 9,869,939 B2 | 1/2018 | Yu et al. |
| 11,016,383 B2 * | 5/2021 | Lin ............... G03F 1/22 |
| 2016/0313637 A1 * | 10/2016 | Jansen ........... G03F 7/70983 |
| 2017/0205704 A1 * | 7/2017 | Nikipelov ....... G03F 7/70958 |
| 2018/0329291 A1 * | 11/2018 | Timmermans ...... G03F 1/64 |
| 2018/0348626 A1 * | 12/2018 | Ahn ............... G03F 1/62 |
| 2018/0373141 A1 * | 12/2018 | Brouns ........... G03F 1/66 |
| 2020/0073230 A1 * | 3/2020 | Lin ............... G03F 1/80 |

FOREIGN PATENT DOCUMENTS

| | | | |
|---|---|---|---|
| CN | 101012343 A | 8/2007 | |
| KR | 10-2016-0088209 A | 7/2016 | |
| TW | 201736941 A | 10/2017 | |
| TW | 201807507 A | 3/2018 | |
| WO | 2017102379 | * 6/2017 | ........... G03F 1/24 |
| WO | 2017186486 | * 11/2017 | |
| WO | 2019031361 | * 2/2019 | |

OTHER PUBLICATIONS

Timmermanns et al., "CNT EUV pellicle: Moving towards a full size solution" Proc. SPIE 10451 articles 104510P, 16 pages (Oct. 2017).*
Peter et al., "Towards suitable multilayer pellicle architecture for application in high power EUV systems", euspen 16th Internat. Confer. Exhib., 2 pages (May 2016).*
Lee et al., "Temperature distribution of the multi-stack EUV pellicle with various structures and materials", presentation at Intern. Symp. Extreme UV lith., (Oct. 2015).*
Lairson et al., "Adhesive free zirconium mesh and ZrB2/Zr ultrathin membranes", presentation at Intern. Symp. Extreme UV lith., (Oct. 2013).*
Lee et al., "Multistack structure for an extreme-ultraviolet pellicle with out of band radiation reduction" J. Micro/Nanolith MEMS MOEMS vol. 14(4), article 043501, 6 pages (Oct. 12, 2015).*
Park et al., "Lifetime estimation of extreme-ultraviolet pellicle at 500W source power by thermal stress analysis" Proc SPIE 10450, article 104501K, 6 pages (Oct. 2017).*
Machine translation of WO 2019/031361 (2019).*

* cited by examiner

*Primary Examiner* — Martin J Angebranndt
(74) *Attorney, Agent, or Firm* — McDermott Will & Emery LLP

(57) ABSTRACT

A pellicle for an EUV photo mask includes a base membrane layer, a core layer disposed over the base membrane layer and one or more metallic layers disposed over the core layer.

20 Claims, 10 Drawing Sheets

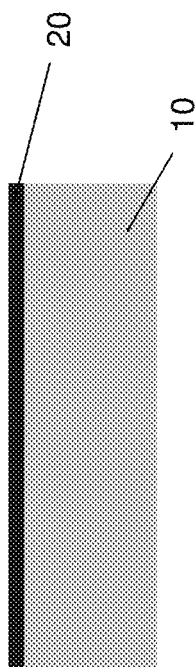
FIG. 1
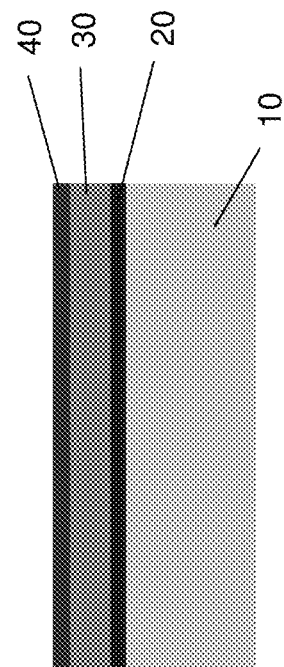
FIG. 2
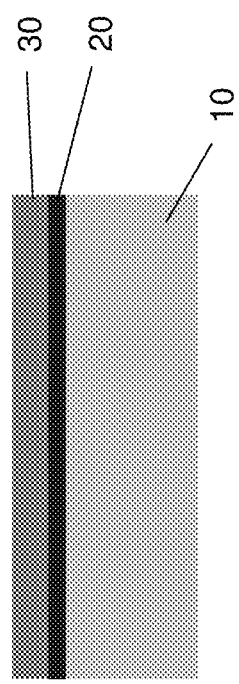
FIG. 3
FIG. 4

| 2nd metallic layer (130) | 1st metallic layer (120) | Cover layer (40) | Core layer (30) | ESL layer (20) | EUV transmittance | EUV reflectance |
|---|---|---|---|---|---|---|
| Ru (2 nm) | Mo (4.5 nm) | SiN (2.5 nm) | p-Si (40 nm) | SiN (2.5 nm) | 84.79 % | 0.249 % |
| Ru (2 nm) | Zr (3.5 nm) | SiN (2.5 nm) | p-Si (30 nm) | SiN (2.5 nm) | 87.72 % | 0.200 % |
| Ru (1 nm) | Zr (4 nm) | SiN (2.5 nm) | p-Si (30 nm) | SiN (2.5 nm) | 89.07 % | 0.020 % |
| Ru (0.5 nm) | Zr (5 nm) | SiN (2.5 nm) | p-Si (30 nm) | SiN (2.5 nm) | 89.45 % | 0.007 % |
| Ru (2 nm) | Mo (4.5 nm) | | | SiC (20 nm) | 86.88 % | 0.120 % |
| Ru (2 nm) | Mo (5 nm) | | | SiC (20 nm) | 86.74 % | 0.063 % |
| Ru (1 nm) | Mo (6 nm) | | | SiC (20 nm) | 87.67 % | 0.012 % |
| Ru (1 nm) | Zr (5.5 nm) | | | SiC (20 nm) | 88.94 % | 0.061 % |

FIG. 31

PELLICLE FOR AN EUV LITHOGRAPHY MASK AND A METHOD OF MANUFACTURING THEREOF

RELATED APPLICATION

This application claims priority of U.S. Provisional Application No. 62/664,524 filed on Apr. 30, 2018, the entire contents of which are incorporated herein by reference.

TECHNICAL FIELD

The disclosure relates to a pellicle for an extreme ultra violet (EUV) lithography photo mask and methods of manufacturing the pellicle.

BACKGROUND

A pellicle is a thin transparent film stretched over a frame that is glued over one side of a photo mask to protect the photo mask from damage, dust and/or moisture. In EUV lithography, a pellicle having a high transparency in the EUV wavelength region, a high mechanical strength and a low thermal expansion is generally required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 shows a cross sectional view of one of the various stages for manufacturing a pellicle for an EUV photo mask in accordance with an embodiment of the present disclosure.

FIG. 2 shows a cross sectional view of one of the various stages for manufacturing a pellicle for an EUV photo mask in accordance with an embodiment of the present disclosure.

FIG. 3 shows a cross sectional view of one of the various stages for manufacturing a pellicle for an EUV photo mask in accordance with an embodiment of the present disclosure.

FIG. 4 shows a cross sectional view of one of the various stages for manufacturing a pellicle for an EUV photo mask in accordance with an embodiment of the present disclosure.

FIG. 31 is a table showing EUV transmittance values and reflectance values for various stacked structures.

DETAILED DESCRIPTION

Figure 6:
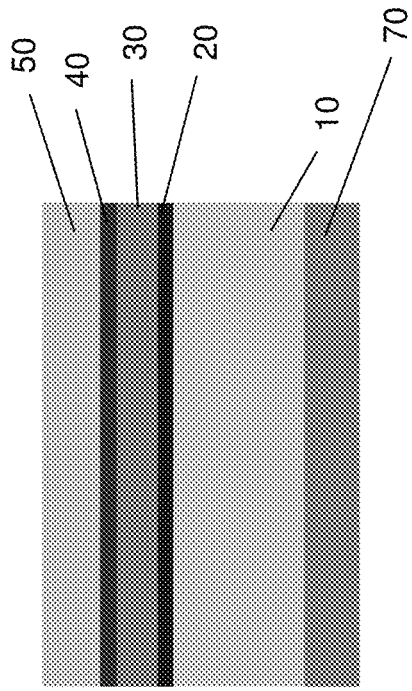
FIG. 6 shows a cross sectional view of one of the various stages for manufacturing a pellicle for an EUV photo mask in accordance with an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained.

A pellicle is a thin transparent film stretched over a frame that is glued over one side of a photo mask, and protects the photo mask from particles, dust, damages and/or contamination. A pellicle generally requires a higher transparency and a lower reflectivity. In UV or DUV lithography, the pellicle film is made of a transparent resin film. In EUV lithography, however, a resin based film is not proper, and a non-organic material, such as a polysilicon, silicide or graphite, is used.

In the present disclosure, the pellicle for an EUV photo mask has a stacked structure of various dielectric, semiconductor and/or metallic materials to enhance an EUV transmittance, to reduce an EUV reflectance, to improve mechanical strength, and/or to improve thermal properties.

In particular, the pellicle according to the present disclosure has an EUV transmittance higher than about 85% in some embodiments, and higher than about 87% in other embodiments, and has an EUV reflectance lower than about 0.25% in some embodiments, and lower than about 0.10% in other embodiments.

FIGS. 1-11 show a sequential manufacturing operation for a pellicle for an EUV photo mask in accordance with an embodiment of the present disclosure. It is understood that additional operations can be provided before, during, and after processes shown by FIGS. 1-11, and some of the operations described below can be replaced or eliminated, for additional embodiments of the method. The order of the operations/processes may be interchangeable.

As shown in FIG. 1, a substrate 10, for example a Si wafer, is prepared. The thickness of the substrate 10 is in a range from about 500 μm to about 1000 μm in some embodiments.

On the substrate 10, a base membrane layer 20 is formed, as shown in FIG. 2. The base membrane layer 20 functions as an etching stop layer in a subsequent substrate etching operation. The base membrane layer 20 includes one or more layers of semiconductor material, such as SiC, SiGe, SiCN, Ge, or dielectric material, such as silicon oxide, silicon nitride and silicon oxynitride, or any other suitable material. In some embodiments, SiC is epitaxially formed on the substrate 10. In other embodiments, the base membrane layer 20 can be an amorphous or polycrystalline SiC, SiGe or Ge layer. In certain embodiments, the base membrane layer 20 is silicon nitride. The thickness of the base membrane layer is in a range from about 0.5 nm to about 40 nm in some embodiments, and is in a range from about 1 nm to about 20 nm in other embodiments. The base membrane layer 20 can be formed by chemical vapor deposition (CVD), physical vapor deposition (PVD), atomic layer deposition (ALD), molecular beam epitaxy (MBE) and any other suitable film formation methods.

After the base membrane layer 20 is formed, a core layer 30 is formed over the base membrane layer 20, as shown in FIG. 3. The core layer 30 includes one or more layers of semiconductor material, such as Si, SiC, SiGe, metal alloys, such as silicide (WSi, NiSi, TiSi, CoSi, MoSi, etc.), or dielectric material, such as silicon nitride. The semiconductor material can be single crystalline, poly crystalline or amorphous. In certain embodiments, a Si layer is epitaxially formed on the SiC base membrane layer. In other embodiments, poly silicon or amorphous silicon is used as the core layer 30. The thickness of the core layer 30 is in a range from about 10 nm to about 50 nm in some embodiments, and is in a range from about 20 nm to about 40 nm in other embodiments. The core layer 30 can be formed by CVD, PVD, ALD, MBE and any other suitable film formation methods. In certain embodiments, a core layer 30 is not formed. In such a case, the base membrane layer 20 has a thickness in a range from about 10 nm to about 30 nm, in some embodiments.

Then, a cover layer 40 is formed over the core layer 30, as shown in FIG. 4. If the core layer 30 is not formed, the cover layer 40 is formed over the base membrane layer 20. The cover layer 40 includes one or more layers of silicon nitride, SiC or SiCN, in some embodiments. In other embodiments, the cover layer 40 is formed by implanting impurities in the Si core layer. The impurities can be boron, phosphorous and/or arsenic. A dose amount of the impurities in in a range from about $10^{17}$-$10^{20}$ ions/cm$^{-2}$ in some embodiments. The thickness of the cover layer 40 is in a range from about 0.5 nm to about 10 nm in some embodiments, and is in a range from about 1 nm to about 5 nm in other embodiments. The cover layer 40 can be formed by CVD, PVD, ALD, MBE and any other suitable film formation methods. In certain embodiments, a cover layer 40 is not formed.

Figure 5:
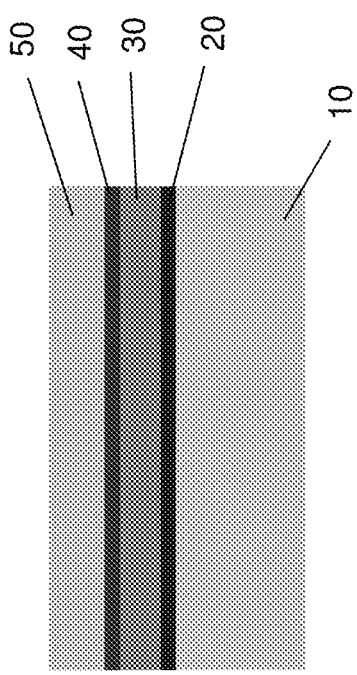
FIG. 5 shows a cross sectional view of one of the various stages for manufacturing a pellicle for an EUV photo mask in accordance with an embodiment of the present disclosure.

Next, as shown in FIG. 5, a protection layer 50 is formed over the cover layer 40. If the cover layer 40 and/or the core layer 30 is/are not formed, the first protection layer 50 is formed over the core layer 30 or the base membrane layer 20. The protection layer 50 includes one or more layers of dielectric material, such as silicon oxide, silicon nitride and silicon oxynitride. In certain embodiments, silicon oxide is used. The thickness of the protection layer 50 is in a range from about 100 nm to about 10 µm in some embodiments. The protection layer 50 can be formed by CVD, PVD, ALD, MBE and any other suitable film formation methods. The first protection layer 50 includes one or more layers of metal based material, for example, Al, Cu, Ta, Ti, Co, Fe, Ni, TaN or TiN and their alloy, in some embodiments. The first protection layer 50 also can be metal oxide, metal nitride, for example SiN, SiO or SiON, in some embodiments. In some embodiments, multiple layers with different materials are used as the first protection layer 50.

Next, as shown in FIG. 6, a hard mask layer 70 is formed over the back side of the substrate 10. The hard mask layer 70 includes one or more layers of dielectric material, such as silicon oxide, silicon nitride and silicon oxynitride. In certain embodiments, silicon nitride is used. The thickness of the hard mask layer 70 is in a range from about 100 nm to about 1000 nm in some embodiments, and is in a range from about 200 nm to about 500 nm in other embodiments. The hard mask layer 70 can be formed by CVD, PVD, ALD, MBE and any other suitable film formation methods.

Figure 8:
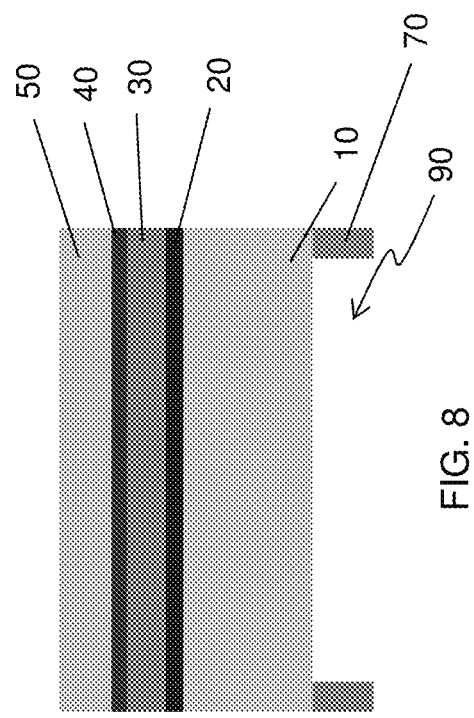
FIG. 8 shows a cross sectional view of one of the various stages for manufacturing a pellicle for an EUV photo mask in accordance with an embodiment of the present disclosure.
Figure 7:
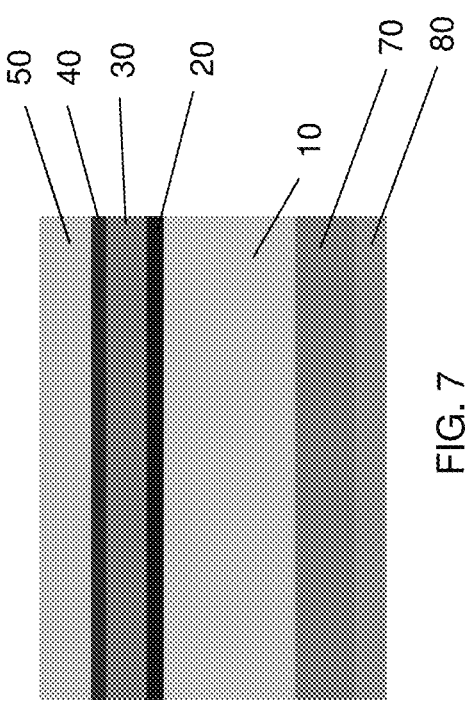
FIG. 7 shows a cross sectional view of one of the various stages for manufacturing a pellicle for an EUV photo mask in accordance with an embodiment of the present disclosure.

Then, a photo resist layer 80 is formed on the hard mask layer 70, as shown in FIG. 7. The thickness of the photo resist layer 80 is in a range from about 1 µm to about 3 µm in some embodiments, One or more lithography operations are performed to pattern the photo resist layer 80, and subsequently, the hard mask layer 70 is patterned by one or more etching operations to form a first opening 90 as shown in FIG. 8. The photo resist layer 80 is removed by suitable resist removal operations.

Figure 9:
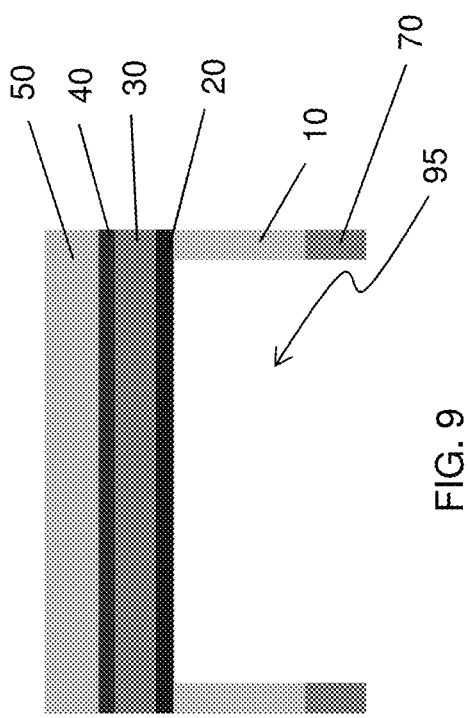
FIG. 9 shows a cross sectional view of one of the various stages for manufacturing a pellicle for an EUV photo mask in accordance with an embodiment of the present disclosure.

Then, the substrate 10 is etched to form a second opening 95, as shown in FIG. 9. In some embodiments, wet etching using KOH, TMAH (tetramethylammonium hydroxide) or EDP (ethylenediamine pyrocatechol) is performed to etch the Si substrate 10. The substrate 10 can also be etched by dry etching process using one or more of $SF_6$, $CF_4$ and $Cl_2$ gas, mixed with $N_2$ and/or $O_2$ gas. In some embodiments, the substrate below the first opening 90 is etched to expose the base membrane layer 20. By this etching operation, a frame structure of the pellicle is formed by a part of the substrate 10 and a part of the hard mask layer 70.

Figure 10:
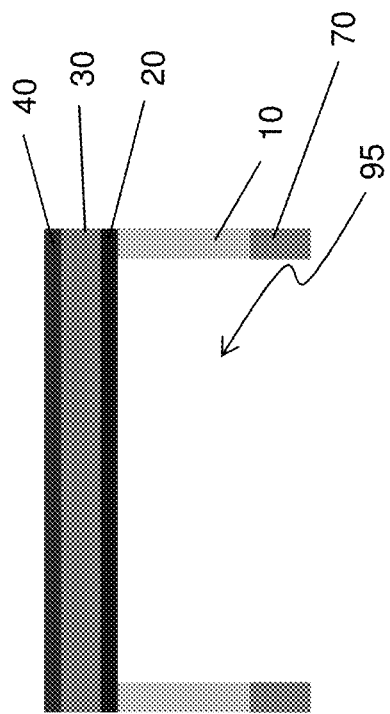
FIG. 10 shows a cross sectional view of one of the various stages for manufacturing a pellicle for an EUV photo mask in accordance with an embodiment of the present disclosure.

Then, the first protection layer 50 is removed by one or more etching operations, as shown in FIG. 10. In some embodiments, a wet etching operation is used.

Figure 11:
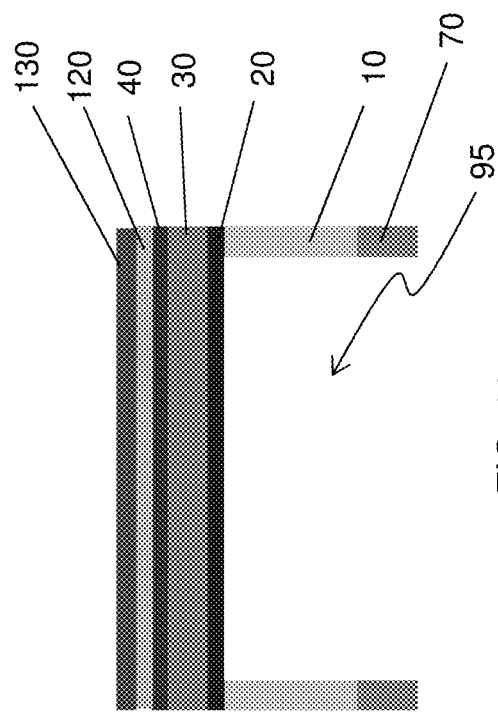
FIG. 11 shows a cross sectional view of one of the various stages for manufacturing a pellicle for an EUV photo mask in accordance with an embodiment of the present disclosure.

Next, as shown in FIG. 11, one or more metallic layers 120 and 130 are formed over the cover layer 40. In some embodiments, a first metallic layer 120 includes a layer of Mo, Zr, Nb, B, and Ti, Ru, or other suitable material. In some embodiments, the second metallic layer 130 includes a Ru layer. In some embodiments, a Ru layer 130 formed on a Mo layer 120 is used. In other embodiments, a Ru layer 130 formed on a Zr layer 120 is used. In certain embodiments, only a Zr layer is formed on the cover layer 40. In certain embodiments, only a Ru layer is formed on the cover layer 40. The thickness of the first metallic layer 120 is greater than the thickness of the second metallic layer 130 in some embodiments. The thickness of the first metallic layer 120 and the second metallic layer 130 is in a range from about 0.5 nm to about 20 nm in some embodiments, and is in a range from about 1 nm to about 10 nm in other embodiments. The second metallic layer 130 is thinner than the first metallic layer 120 in some embodiments. The first metallic layer 120 and the second metallic layer 130 can respectively be formed by CVD, PVD, ALD, electro plating, and any other suitable film formation methods. In certain embodiments, any or all of the metallic layers are further formed on inside walls of the second opening 95. In some embodiments, all of the layers of the pellicle are solid and non-porous layers. In certain embodiments, all of the layers of the pellicle are inorganic.

FIGS. 12-22 show a sequential manufacturing operation for a pellicle for an EUV photo mask in accordance with an embodiment of the present disclosure. It is understood that additional operations can be provided before, during, and after processes shown by FIGS. 12-22, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1-11 may be employed in the following embodiments, and some of the explanations may be omitted. Similarly, materials, configurations, dimensions, structures, conditions and operations the same as or similar to those explained with respect to FIGS. 12-22 may be employed in the foregoing embodiments.

Figure 12:
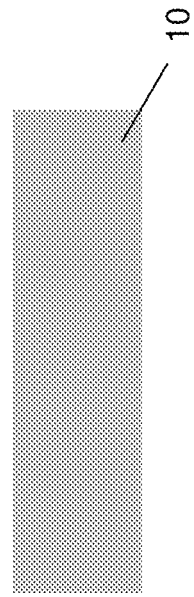
FIG. 12 shows a cross sectional view of one of the various stages for manufacturing a pellicle for an EUV photo mask in accordance with another embodiment of the present disclosure.

As shown in FIG. 12, a substrate 10, for example a Si wafer, is prepared. The thickness of the substrate 10 is in a range from about 500 µm to about 1000 µm in some embodiments.

Figure 13:
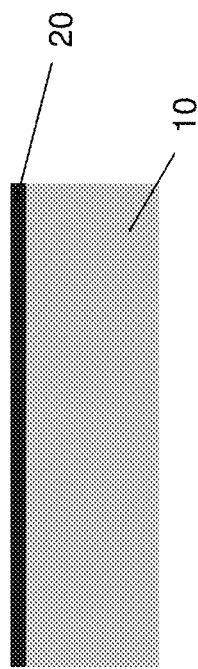
FIG. 13 shows a cross sectional view of one of the various stages for manufacturing a pellicle for an EUV photo mask in accordance with another embodiment of the present disclosure.

On the substrate 10, a base membrane layer 20, as an etching stop layer, is formed, as shown in FIG. 13. The base membrane layer 20 functions as an etching stop layer in a subsequent substrate etching operation. The base membrane layer 20 includes one or more layers of semiconductor material, such as SiC, SiGe, Ge, or dielectric material, such as silicon oxide, silicon nitride and silicon oxynitride, or any other suitable material. In some embodiments, SiC is epitaxially formed on the substrate 10. In other embodiments, the base membrane layer 20 can be an amorphous or polycrystalline SiC, SiGe or Ge layer. In certain embodiments, the base membrane layer 20 is silicon nitride. The thickness of the base membrane layer is in a range from about 0.5 nm to about 40 nm in some embodiments, and is in a range from about 1 nm to about 20 nm in other embodiments. The base membrane layer 20 can be formed by chemical vapor deposition (CVD), physical vapor deposition (PVD), atomic layer deposition (ALD), molecular beam epitaxy (MBE) and any other suitable film formation methods.

Figure 14:
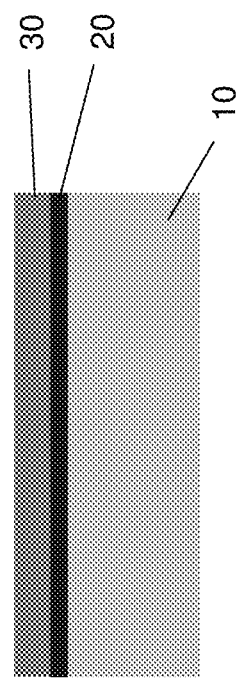
FIG. 14 shows a cross sectional view of one of the various stages for manufacturing a pellicle for an EUV photo mask in accordance with another embodiment of the present disclosure.

After the base membrane layer 20 is formed, a core layer 30 is formed over the base membrane layer 20, as shown in FIG. 14. The core layer 30 includes one or more layers of semiconductor material, such as Si, SiC, SiGe, metal alloys, such as silicide (WSi, NiSi, TiSi, CoSi, MoSi, etc.), or dielectric material, such as silicon nitride. The semiconductor material can be single crystalline, poly crystalline or amorphous. In certain embodiments, a Si layer is epitaxially formed on the SiC base membrane layer. In other embodiments, poly silicon or amorphous silicon is used as the core layer 30. The thickness of the core layer 30 is in a range from about 10 nm to about 50 nm in some embodiments, and is in a range from about 20 nm to about 40 nm in other embodiments. The core layer 30 can be formed by CVD, PVD, ALD, MBE and any other suitable film formation methods. In certain embodiments, a core layer 30 is not formed. In such a case, the base membrane layer 20 has a thickness in a range from about 10 nm to about 30 nm, in some embodiments.

Figure 15:
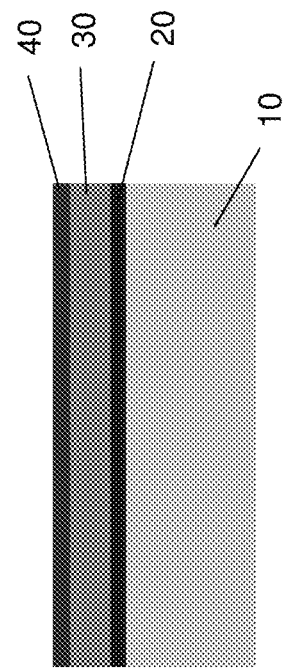
FIG. 15 shows a cross sectional view of one of the various stages for manufacturing a pellicle for an EUV photo mask in accordance with another embodiment of the present disclosure.

Then, a cover layer 40 is formed over the core layer 30, as show in FIG. 15. If the core layer 30 is not formed, the cover layer 40 is formed over the base membrane layer 20. The cover layer 40 includes one or more layers of silicon nitride and SiC, in some embodiments. In other embodiments, the cover layer 40 is formed by implanting impurities in the Si core layer. The impurities can be boron, phosphorous and/or arsenic. The thickness of the cover layer 40 is in a range from about 0.5 nm to about 10 nm in some embodiments, and is in a range from about 1 nm to about 5 nm in other embodiments. The cover layer 40 can be formed by CVD, PVD, ALD, MBE and any other suitable film formation methods. In certain embodiments, a cover layer 40 is not formed.

Figure 16:
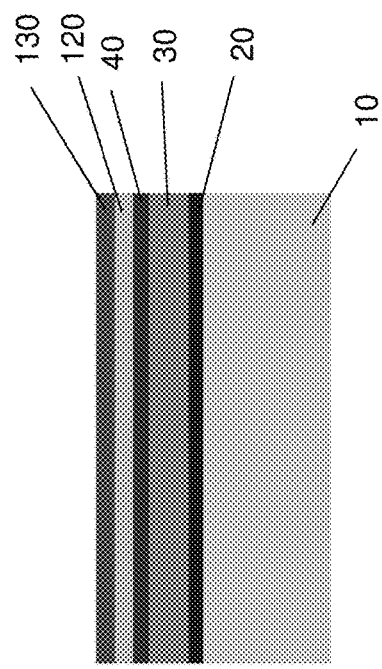
FIG. 16 shows a cross sectional view of one of the various stages for manufacturing a pellicle for an EUV photo mask in accordance with another embodiment of the present disclosure.

Next, as shown in FIG. 16, one or more metallic layers 120 and 130 are formed over the cover layer 40. If the cover layer 40 and/or the core layer 30 is/are not formed, the metallic layers are formed over the core layer 30 or the base membrane layer 20. In some embodiments, a first metallic layer 120 includes a layer of Mo, Zr, Nb and Ti, B or other suitable material. In some embodiments, the second metallic layer 130 includes a Ru layer. In some embodiments, a Ru layer 130 formed on a Mo layer 120 is used. In other embodiments, a Ru layer 130 formed on a Zr layer 120 is used. In certain embodiments, only a Zr layer is formed on the cover layer 40. In certain embodiments, only a Ru layer is formed on the cover layer 40. The thickness of the first metallic layer 120 is greater than the thickness of the second metallic layer 130 in some embodiments. The thickness of each of the first metallic layer 120 and the second metallic layer 130 is in a range from about 0.5 nm to about 20 nm in some embodiments, and is in a range from about 1 nm to about 10 nm in other embodiments. The second metallic layer 130 is thinner than the first metallic layer 120 in some embodiments. The first metallic layer 120 and the second metallic layer 130 can respectively be formed by CVD, PVD, ALD, electroplating, and any other suitable film formation methods.

Figure 17:
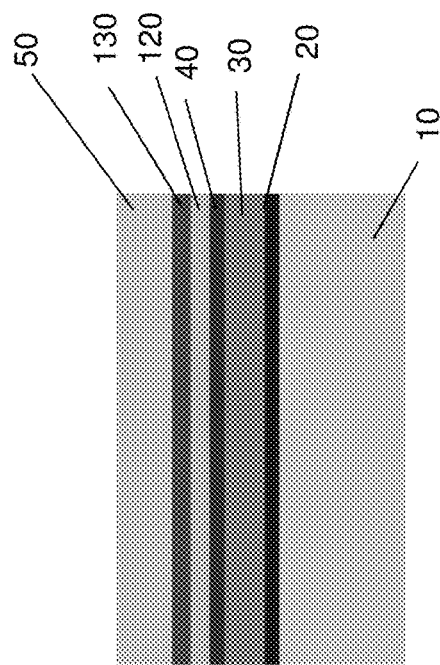
FIG. 17 shows a cross sectional view of one of the various stages for manufacturing a pellicle for an EUV photo mask in accordance with another embodiment of the present disclosure.

Next, as shown in FIG. 17, a protection layer 50 is formed over the metallic layer 120, 130. The protection layer 50 includes one or more layers of dielectric material, such as silicon oxide, silicon nitride and silicon oxynitride. In certain embodiments, silicon oxide is used. In other embodiments, a stacked layer of silicon nitride formed on silicon oxide is used. The thickness of the first protection layer 50 is in a range from about 500 nm to about 10 µm in some embodiments. The first protection layer 50 can be formed by CVD, PVD, ALD, MBE and any other suitable film formation methods. The first protection layer 50 can be metal based material, for example, Al, Cu, Ta, Ti, Ni, Co, Fe, TaN or TiN and an alloy thereof. The first protection layer can be metal oxide, metal nitride such as SiN, SiO or SiON in some embodiments.

Figure 18:
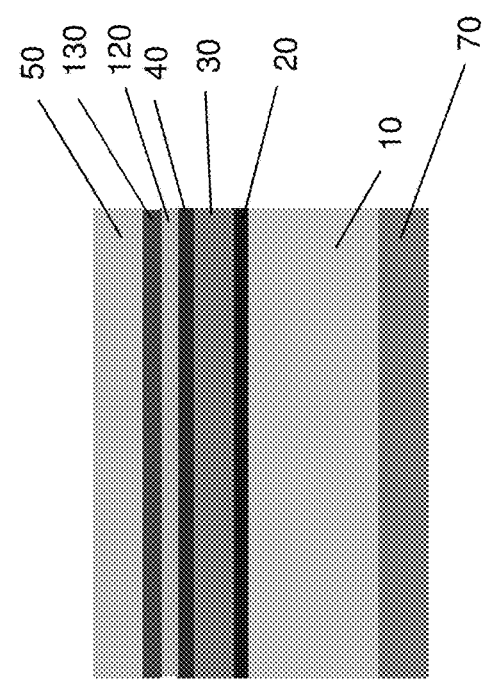
FIG. 18 shows a cross sectional view of one of the various stages for manufacturing a pellicle for an EUV photo mask in accordance with another embodiment of the present disclosure.

Next, as shown in FIG. 18, a hard mask layer 70 is formed over the back side of the substrate 10. The hard mask layer 70 includes one or more layers of dielectric material, such as silicon oxide, silicon nitride and silicon oxynitride. In certain embodiments, silicon nitride is used. The thickness of the hard mask layer 70 is in a range from about 100 nm to about 1000 nm in some embodiments, and is in a range from about 200 nm to about 500 nm in other embodiments. The hard mask layer 70 can be formed by CVD, PVD, ALD, MBE and any other suitable film formation methods.

Figure 19:
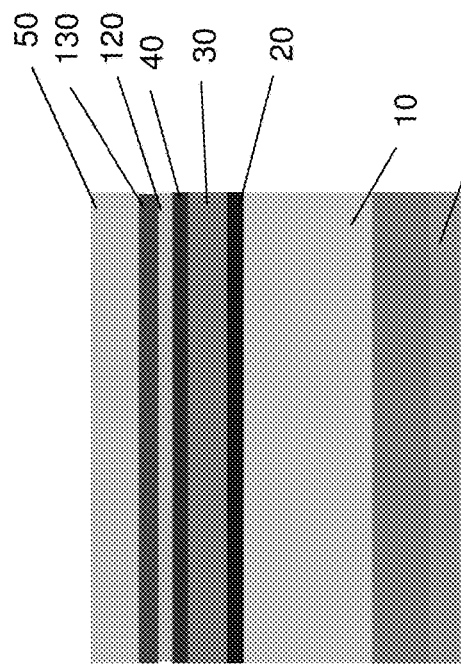
FIG. 19 shows a cross sectional view of one of the various stages for manufacturing a pellicle for an EUV photo mask in accordance with another embodiment of the present disclosure.
Figure 20:
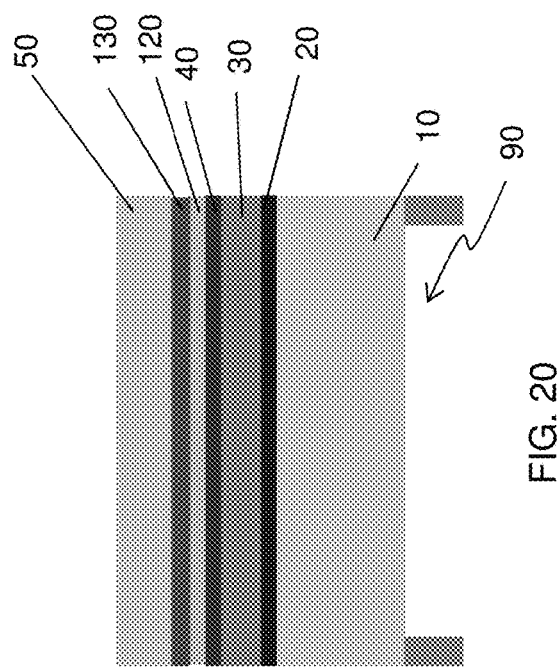
FIG. 20 shows a cross sectional view of one of the various stages for manufacturing a pellicle for an EUV photo mask in accordance with another embodiment of the present disclosure.

Then, a photo resist layer 80 is formed on the hard mask layer 80, as shown in FIG. 19. The thickness of the photo resist layer 80 is in a range from about 1 µm to about 3 µm in some embodiments, One or more lithography operations are performed to pattern the photo resist layer 80, and subsequently, the hard mask layer 70 is patterned by one or more etching operations to form a first opening 90 as shown in FIG. 20. The photo resist layer 80 is removed by suitable resist removal operations.

Figure 21:
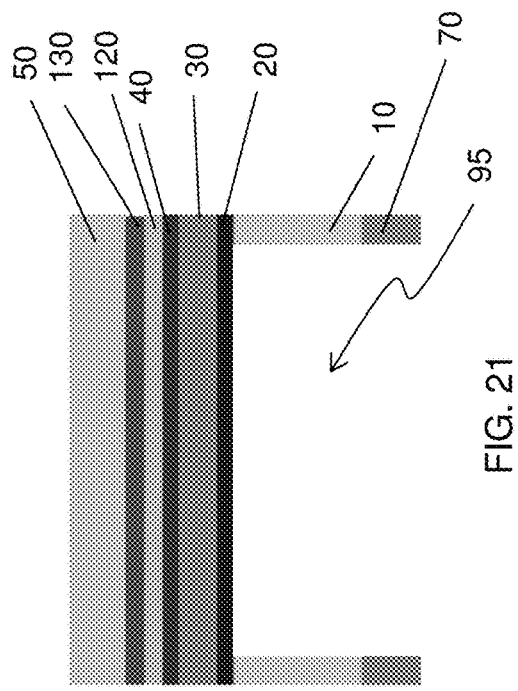
FIG. 21 shows a cross sectional view of one of the various stages for manufacturing a pellicle for an EUV photo mask in accordance with another embodiment of the present disclosure.

Then, the substrate 10 is etched to form a second opening 95, as shown in FIG. 21. In some embodiments, wet etching using KOH, TMAH or EDP is performed to etch the Si substrate 10. The substrate can also be etched using drying etching by one or more of $SF_6$, $CF_4$ and $Cl_2$ gas, mixed with $N_2$ and/or $O_2$ gas. In some embodiments, the substrate below the first opening 90 is etched to expose the base membrane layer 20. By this etching operation, a frame structure of the pellicle is formed by a part of the substrate 10 and a part of the hard mask layer 70.

Figure 22:
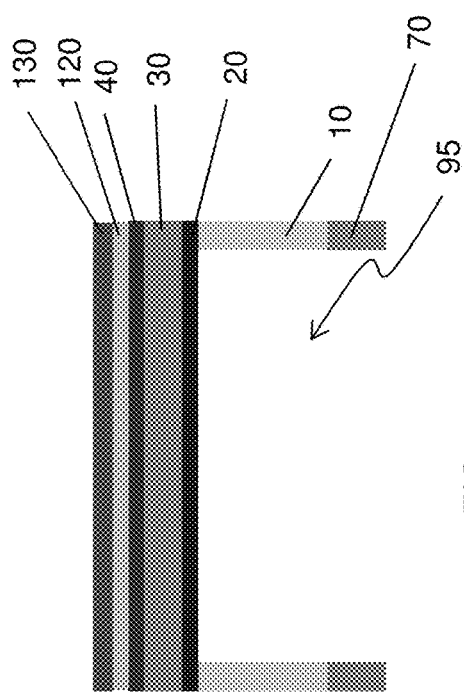
FIG. 22 shows a cross sectional view of one of the various stages for manufacturing a pellicle for an EUV photo mask in accordance with another embodiment of the present disclosure.

Then, the protection layer 50 is removed by one or more etching operations, as shown in FIG. 22. In some embodiments, a wet etching operation is used. In some embodiments, a wet etching operation is used. In some embodiments, all of the layers of the pellicle are solid and non-porous layers. In certain embodiments, all of the layers of the pellicle are inorganic.

FIGS. 23-28 show a sequential manufacturing operation for a pellicle for an EUV photo mask in accordance with an embodiment of the present disclosure. It is understood that additional operations can be provided before, during, and after processes shown by FIGS. 23-28, and some of the operations described below can be replaced or eliminated, for additional embodiments of the method. The order of the operations/processes may be interchangeable. Materials, configurations, dimensions, structures, conditions and operations the same as or similar to those explained with respect to FIGS. 1-22 may be employed in the following embodiments, and some of the explanations may be omitted. Similarly, materials, configurations, dimensions, structures, conditions and operations the same as or similar to those explained with respect to FIGS. 23-28 may be employed in the foregoing embodiments.

Figure 23:
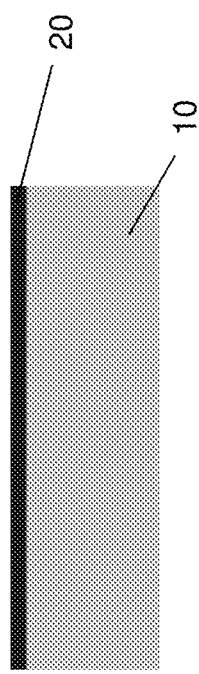
FIG. 23 shows a cross sectional view of one of the various stages for manufacturing a pellicle for an EUV photo mask in accordance with another embodiment of the present disclosure.

A substrate 10, for example a Si wafer, is prepared. The thickness of the substrate 10 is in a range from about 500 µm to about 1000 µm in some embodiments. On the substrate 10, a base membrane layer 20, as an etching stop layer, is formed, as shown in FIG. 23. The base membrane layer 20 functions as an etching stop layer in a subsequent substrate etching operation. The base membrane layer 20 includes one or more layers of semiconductor material, such as SiC, SiGe, Ge, or dielectric material, such as silicon oxide, silicon nitride and silicon oxynitride, or any other suitable material. In some embodiments, SiC is epitaxially formed on the substrate 10. In other embodiments, the base membrane layer 20 can be an amorphous or polycrystalline SiC, SiGe or Ge layer. In certain embodiments, the base membrane layer 20 is silicon nitride. The thickness of the base membrane layer is in a range from about 0.5 nm to about 40 nm in some embodiments, and is in a range from about 1 nm to about 20 nm in other embodiments. The base membrane layer 20 can be formed by chemical vapor deposition (CVD), physical vapor deposition (PVD), atomic layer deposition (ALD), molecular beam epitaxy (MBE) and any other suitable film formation methods.

Figure 24:
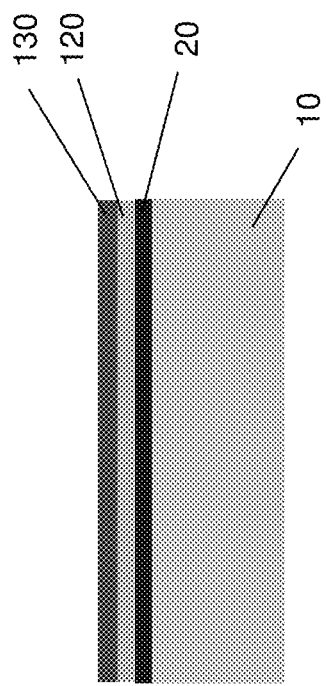
FIG. 24 shows a cross sectional view of one of the various stages for manufacturing a pellicle for an EUV photo mask in accordance with another embodiment of the present disclosure.

Next, as shown in FIG. 24, one or more metallic layers 120 and 130 are formed over the base membrane layer 20. In some embodiments, a first metallic layer 120 includes a layer of Mo, Zr, Nb, B, and Ti, Ru, or other suitable material. In some embodiments, the second metallic layer 130 includes a Ru layer. In some embodiments, a Ru layer 130 formed on a Mo layer 120 is used. In other embodiments, a Ru layer 130 formed on a Zr layer 120 is used. In certain embodiments, only a Zr layer is formed on the cover layer 40. In certain embodiments, only a Ru layer is formed on the base membrane layer 20. The thickness of the first metallic layer 120 is greater than the thickness of the second metallic layer 130 in some embodiments. The thickness of the first metallic layer 120 and the second metallic layer 130 is in a range from about 0.5 nm to about 20 nm in some embodiments, and is in a range from about 1 nm to about 10 nm in other embodiments. The second metallic layer 130 is thinner than the first metallic layer 120 in some embodiments. The first metallic layer 120 and the second metallic layer 130 can respectively be formed by CVD, PVD, ALD, electro plating, and any other suitable film formation methods. In some embodiments, all of the layers of the pellicle are solid and non-porous layers. In certain embodiments, all of the layers of the pellicle are inorganic.

Figure 25:
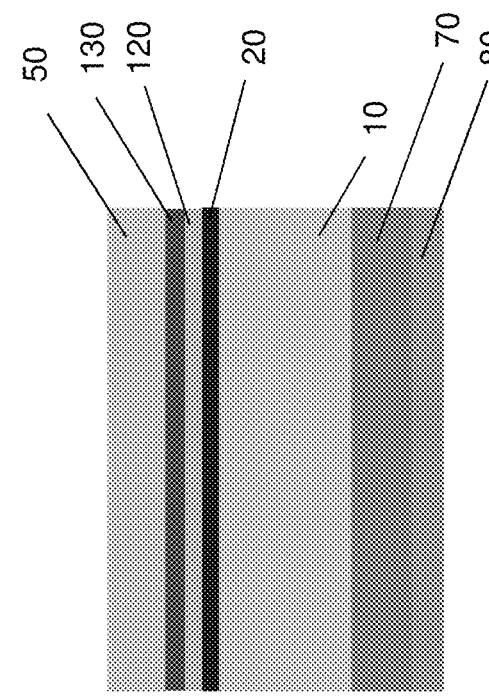
FIG. 25 shows a cross sectional view of one of the various stages for manufacturing a pellicle for an EUV photo mask in accordance with another embodiment of the present disclosure.

Next, as shown in FIG. 25, a protection layer 50 is formed over the second metallic layer 130. The protection layer 50 includes one or more layers of dielectric material, such as silicon oxide, silicon nitride and silicon oxynitride. In certain embodiments, silicon oxide is used. The thickness of the protection layer 50 is in a range from about 100 nm to about 10 μm in some embodiments. The protection layer 50 can be formed by CVD, PVD, ALD, MBE and any other suitable film formation methods. The first protection layer 50 can be metal based material, for example, Al, Cu, Ta, Ti, Co, Fe, Ni, TaN or TiN and their alloy. In some embodiments, multiple layers with different materials are used as the first protection layer 50.

Further, as shown in FIG. 25, a hard mask layer 70 is formed over the back side of the substrate 10. The hard mask layer 70 includes one or more layers of dielectric material, such as silicon oxide, silicon nitride and silicon oxynitride. In certain embodiments, silicon nitride is used. The thickness of the hard mask layer 70 is in a range from about 100 nm to about 1000 nm in some embodiments, and is in a range from about 200 nm to about 500 nm in other embodiments. The hard mask layer 70 can be formed by CVD, PVD, ALD, MBE and any other suitable film formation methods.

Figure 26:
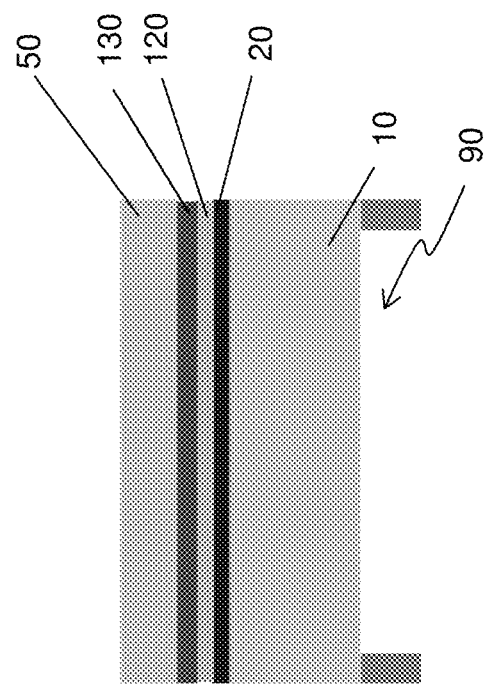
FIG. 26 shows a cross sectional view of one of the various stages for manufacturing a pellicle for an EUV photo mask in accordance with another embodiment of the present disclosure.

Then, a photo resist layer 80 is formed on the hard mask layer 80, as shown in FIG. 25. The thickness of the photo resist layer 80 is in a range from about 1 μm to about 3 μm in some embodiments, One or more lithography operations are performed to pattern the photo resist layer 80, and subsequently, the hard mask layer 70 is patterned by one or more etching operations to form a first opening 90 as shown in FIG. 26. The photo resist layer 80 is removed by suitable resist removal operations.

Figure 27:
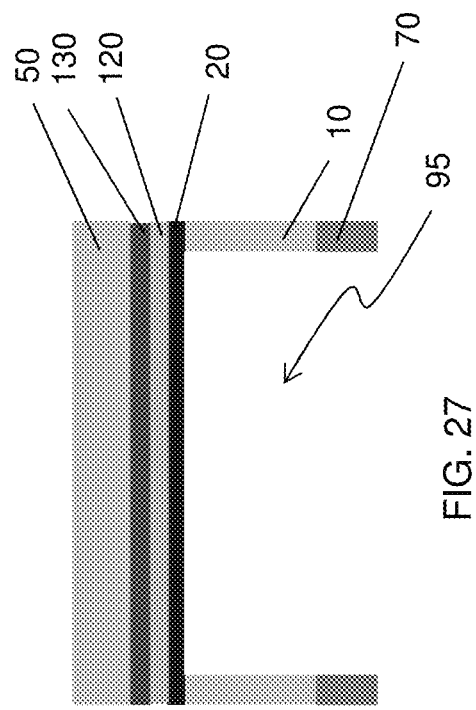
FIG. 27 shows a cross sectional view of one of the various stages for manufacturing a pellicle for an EUV photo mask in accordance with another embodiment of the present disclosure.

Then, the substrate 10 is etched to form a second opening 95, as shown in FIG. 27. In some embodiments, wet etching using KOH, TMAH or EDP is performed to etch the Si substrate 10. In some embodiments, the substrate below the first opening 90 is etched to expose the base membrane layer 20. By this etching operation, a frame structure of the pellicle is formed by a part of the substrate 10 and a part of the hard mask layer 70.

Figure 28:
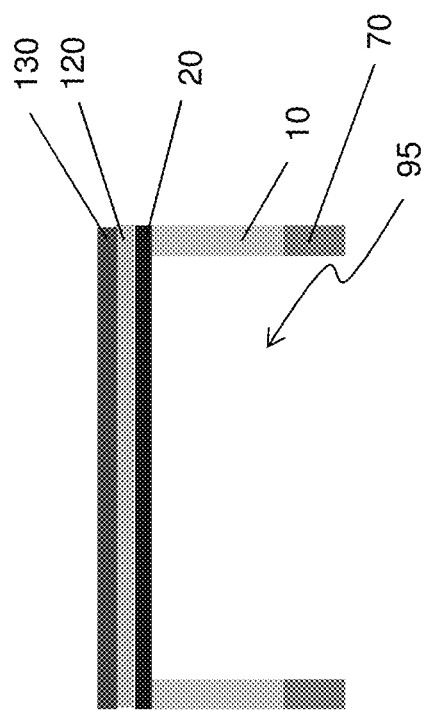
FIG. 28 shows a cross sectional view of one of the various stages for manufacturing a pellicle for an EUV photo mask in accordance with another embodiment of the present disclosure.

Then, the protection layer 50 is removed by one or more etching operations, as shown in FIG. 28. In some embodiments, a wet etching operation is used. In some embodiments, a wet etching operation is used. In some embodiments, all of the layers of the pellicle are solid and non-porous layers. In certain embodiments, all of the layers of the pellicle are inorganic. As shown in FIG. 28, the core layer 30 and the cover layer 40 are not formed, and the first metallic layer 120 and the second metallic layer 130 are disposed directly on the base membrane layer 20. The pellicle is a three layer (only three layers) structure.

Figure 29:
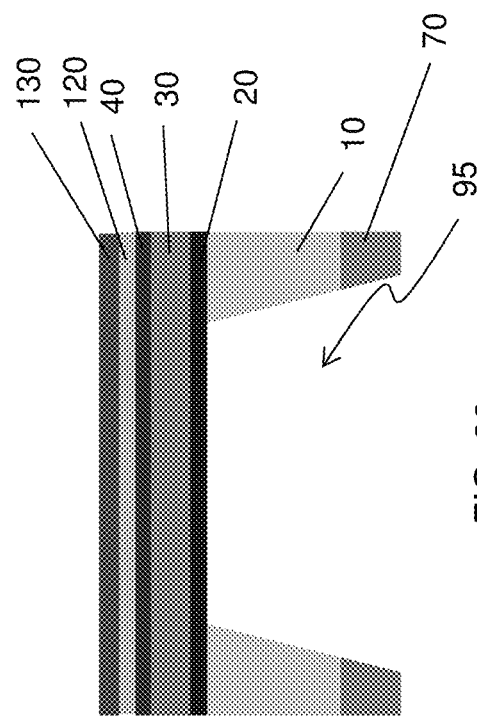
FIG. 29 shows a cross sectional view of pellicles for an EUV photo mask in accordance with another embodiment of the present disclosure.

FIG. 29 shows a cross sectional views of pellicles for an EUV photo mask in accordance with another embodiment of the present disclosure. In this embodiment, the frame structure has a tapered shape having a larger opening at the hard mask layer 70 side than at the base membrane 20 side.

In some embodiments, a capping layer 25 is disposed between the base membrane layer 20 and the core layer 30. The capping layer 25 includes one or more layers of dielectric material or metallic material. In some embodiments, one or more of silicon oxide, silicon nitride and silicon oxynitride, Ni, Al, Cu, Ta, Ti, TaN or TiN. The thickness of the capping layer 25 is in a range from about 0.5 nm to about 20 nm in some embodiments. The capping layer 25 can be formed by CVD, PVD, ALD, MBE and any other suitable film formation methods. In certain embodiments, no capping layer is formed on opposite side (substrate side) of the base membrane layer.

EUV transmittance values and reflectance values at a wavelength of 13.5 nm can be adjusted by selecting materials and/or thickness of the stacked structures of the pellicle. In some embodiments, the stacked structure includes Ru/Mo/SiN/poly Si/SiN or Ru/Zr/SiN/poly Si/SiN. In other embodiments, the stacked structure includes Ru/Mo/SiC or Ru/Zr/SiC. For example, when a Zr layer is used instead of a Mo layer, it is possible to increase the EUV transmittance and to reduce EUV reflectance. Further, a SiC base membrane layer, which is less fragile than polysilicon, also provides a higher EUV transmittance and a lower EUV reflectance. By selecting the materials and/or thicknesses of the stacked layer of an EUV pellicle, it is possible to obtain an EUV transmittance higher than about 85% in some embodiments, and higher than about 87% in other embodiments (and up to about 90%), and an EUV reflectance lower than 0.25% in some embodiments, and lower than 0.10% in other embodiments (or even smaller than 0.05% and as small as 0.01%).

Figure 30:
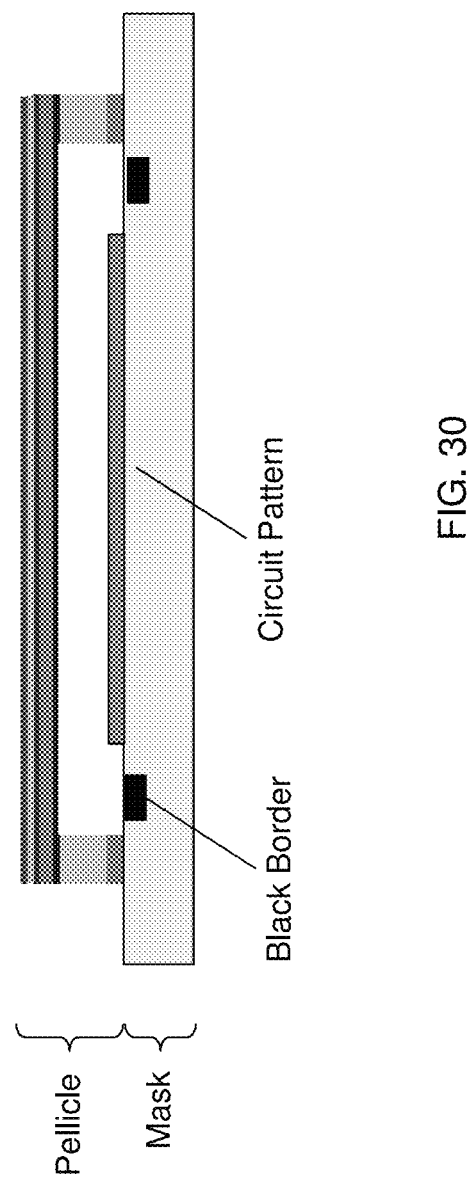
FIG. 30 shows a cross sectional view illustrating a pellicle attached to an EUV photo mask in accordance with an embodiment of the present disclosure.

FIG. 30 shows a cross sectional view illustrating a pellicle attached to an EUV photo mask in accordance with an embodiment of the present disclosure. The frame structure of the pellicle is attached to the surface of the EUV photo mask with an appropriate bonding material. The bonding material is an adhesive, such as acrylic or silicon based glue or A-B cross link type glue. The size of the frame structure is larger than the area of black borders of the EUV photo mask so that the pellicle covers not only the circuit pattern area of the photo mask but also the black borders.

FIG. 31 is a table showing EUV transmittance values and reflectance values at a wavelength of 13.5 nm for various stacked structures. As understood form the table of FIG. 31, when a Zr layer is used instead of a Mo layer, it is possible to increase the EUV transmittance and to reduce EUV reflectance. Further, a SiC base membrane layer, which is less fragile than polysilicon, also provides a higher EUV transmittance and a lower EUV reflectance. By selecting the materials and/or thicknesses of the stacked layer of an EUV pellicle, it is possible to obtain an EUV transmittance higher than about 85% in some embodiments, and higher than about 87% in other embodiments (and up to about 90%), and an reflectance lower than 0.25% in some embodiments, and lower than 0.10% in other embodiments (or even smaller than 0.05% and as small as 0.01%).

In some embodiments of the present disclosure, a photo resist pattern is formed by using the EUV phot mask with the pellicle as described above. The EUV phot mask with the pellicle is set in an EUV exposure tool. A substrate (wafer) coated with a photo resist is also placed in the EUV exposure tool. An EUV light is generated at an EUV light source and guided on to the EUV phot mask through the pellicle. The EUV light is then reflected by the EUV photo mask and the reflected light having circuit pattern information is guided on to the photo resist layer on the substrate. The developing operation is performed to form a photo resist pattern. Then, by using the photo resist pattern as an etching mask, an under-layer is pattered by one or more etching operations to manufacturing patterns for a semiconductor device.

The pellicles according to embodiments of the present disclosure can provide a higher strength and thermal conductivity (dissipation) as well as higher EUV transmittance and lower EUV reflectance.

It will be understood that not all advantages have been necessarily discussed herein, no particular advantage is required for all embodiments or examples, and other embodiments or examples may offer different advantages.

In accordance with an aspect of the present disclosure, a pellicle for an EUV photo mask has an EUV transmittance higher than 85% and an EUV reflectance lower than 0.25%, at a wavelength of 13.5 nm. In one or more of the foregoing and following embodiments, the EUV transmittance is higher than 87%. In one or more of the foregoing and following embodiments, the EUV reflectance is lower than 0.10%.

In accordance with another aspect of the present disclosure, a pellicle for an EUV photo mask includes a base membrane layer, a core layer disposed over the base membrane layer, and one or more metallic layers disposed over the core layer. In one or more of the foregoing and following embodiments, the pellicle further includes a cover layer disposed between the core layer and the one or more metallic layers. In one or more of the foregoing and following embodiments, the cover layer is a silicon nitride layer. In one or more of the foregoing and following embodiments, the cover layer is a doped region of a Si layer. In one or more of the foregoing and following embodiments, the base membrane layer is made of SiC. In one or more of the foregoing and following embodiments, the base membrane layer is made of silicon nitride. In one or more of the foregoing and following embodiments, the one or more metallic layers includes a first metallic layer and a second metallic layer disposed over the first metallic layer. In one or more of the foregoing and following embodiments, the second metallic layer is a Ru layer. In one or more of the foregoing and following embodiments, the first metallic layer is a Mo layer. In one or more of the foregoing and following embodiments, the first metallic layer is a Zr layer. In one or more of the foregoing and following embodiments, the core layer is a Si layer. In one or more of the foregoing and following embodiments, the Si layer is a poly silicon layer.

In accordance with another aspect of the present disclosure, a pellicle for an EUV photo mask includes a base membrane layer, and one or more metallic layers directly disposed on the base membrane layer. In one or more of the foregoing and following embodiments, the one or more metallic layers includes a first metallic layer and a second metallic layer disposed over the first metallic layer. In one or more of the foregoing and following embodiments, the second metallic layer is a Ru layer. In one or more of the foregoing and following embodiments, the first metallic layer is a Mo layer. In one or more of the foregoing and following embodiments, the first metallic layer is a Zr layer.

In accordance with one aspect of the present disclosure, in a method of manufacturing a pellicle for an EUV photo mask, a base membrane layer is formed over a front surface of a substrate. A core layer is formed over the base membrane layer. A cover layer is formed over the core layer. A first protection layer is formed over the cover layer. A second protection layer is formed over the first protection layer. A hard mask layer is formed on a back surface of the substrate. A first opening is formed in the hard mask by patterning the hard mask. The second protection layer is removed. A third protection layer is formed over the first protection layer. A second opening is formed in the substrate by etching the substrate through the first opening. The third protection layer and the first protection layer are removed. One or more metallic layers are formed over the cover layer. In accordance with another aspect of the present disclosure, in a method of manufacturing a pellicle for an EUV photo mask, a base membrane layer is formed over a front surface of a substrate, a core layer is formed over the base membrane layer, a cover layer is formed over the core layer, one or more metallic layers are formed over the cover layer, a first protection layer is formed over the one or more metallic layers, a second protection layer is formed over the first protection layer, a hard mask layer is formed on a back surface of the substrate, a first opening is formed in the hard mask by patterning the hard mask, the second protection layer is removed, a third protection layer is formed over the first protection layer, a second opening is formed in the substrate by etching the substrate through the first opening, the third protection layer and the first protection layer are removed. In one or more of the foregoing and following embodiments, the base membrane layer is made of SiC. In one or more of the foregoing and following embodiments, the base membrane layer is made of silicon nitride. In one or more of the foregoing and following embodiments, the core layer is a Si layer. In one or more of the foregoing and following embodiments, the Si layer is a poly silicon layer. In one or more of the foregoing and following embodiments, the cover layer is formed by implanting impurities in the core layer. In one or more of the foregoing and following embodiments, the cover layer is a silicon nitride layer. In one or more of the foregoing and following embodiments, the one or more metallic layers includes a first metallic layer and a second metallic layer disposed over the first metallic layer. In one or more of the foregoing and following embodiments, the second metallic layer is a Ru layer. In one or more of the foregoing and following embodiments, the first metallic layer is a Mo layer. In one or more of the foregoing and following embodiments, the first metallic layer is a Zr layer. In one or more of the foregoing and following embodiments, the first protection layer is made of a dielectric material. In one or more of the foregoing and following embodiments, the dielectric material includes silicon oxide or silicon nitride. In one or more of the foregoing and following embodiments, the second protection layer is made of a different material than the first protection layer and includes metallic material. In one or more of the foregoing and following embodiments, the third protection layer includes a metallic material. In one or more of the foregoing and following embodiments, the metallic material for the third protection layer is Ni. In one or more of the foregoing and following embodiments, the hard mask layer is made of dielectric material. In one or more of the foregoing and following embodiments, the dielectric material is silicon nitride.

In accordance with another aspect of the present disclosure, in a method of manufacturing a pellicle for an EUV photo mask, a base membrane layer is formed over a front surface of a substrate. One or more metallic layers are formed over the base membrane layer. A first protection layer is formed over the one or more metallic layers. A second protection layer is formed over the first protection layer. A hard mask layer is formed on a back surface of the substrate. A first opening is formed in the hard mask by patterning the hard mask. The second protection layer is removed. A third protection layer is formed over the first protection layer. A second opening is formed in the substrate by etching the substrate through the first opening. The third protection layer and the first protection layer are removed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A pellicle for an EUV photo mask comprising:
a frame portion made of Si; and
a membrane disposed on the frame and including at least one metal layer, wherein:
the membrane consisting of equal to or less than five layers or equal to or more than three layers,
the pellicle has an EUV transmittance higher than 85% and smaller than 87.72% and an EUV reflectance lower than 0.25% and greater than 0.01%, at a wavelength of 13.5 nm,
the membrane consists of:
a base membrane layer made of silicon nitride or SiC;
a core layer disposed on the base membrane layer;
a cover layer disposed on the core layer and made of a doped silicon layer;
a first metal layer disposed on the cover layer and made of Mo or Zr; and
a second metal layer disposed on the first metal layer and made of Ru,
a thickness of the core layer is largest in the membrane and in a range from 10 nm to 50 nm,
a thickness of the second metal layer is smaller than a thickness of the first metal layer, and
a thickness of the cover layer is smaller than the thickness of the first metal layer and in a range from 0.5 nm to 10 nm.

2. The pellicle of claim 1, wherein the EUV transmittance is smaller than 86.88%.

3. The pellicle of claim 1, wherein the EUV reflectance is lower than 0.20%.

4. The pellicle of claim 1, wherein the base membrane is made of SiC.

5. The pellicle of claim 1, wherein the core layer is made of poly silicon or amorphous silicon.

6. The pellicle of claim 1, wherein, a thickness of the core layer is in a range from 20 nm to 40 nm.

7. A pellicle for an EUV photo mask, comprising:
a frame portion having an opening; and
a membrane disposed on the frame and consisting of five layers, wherein:
the five layers are:
a base membrane layer made of silicon nitride or SiC;
a core layer disposed on the base membrane layer and made of polysilicon or amorphous silicon;
a cover layer disposed on the core layer;
a first metal layer disposed on the cover layer; and
a second metal layer disposed on the first metal layer,
a thickness of the base membrane layer is in a range from 1 nm to 40 nm, and
a thickness of the first metal layer is in a range from 1 nm to 10 nm and greater than a thickness of the second metal layer.

8. The pellicle of claim 7, wherein the frame portion is made of Si.

9. The pellicle of claim 7, wherein the cover layer is a silicon nitride layer.

10. The pellicle of claim 7, wherein the cover layer is a doped region of a Si layer.

11. The pellicle of claim 7, wherein the second metal layer is a Ru layer.

12. The pellicle of claim 7, wherein the first metal layer is a Mo layer.

13. The pellicle of claim 7, wherein the first metal layer is a Zr layer.

14. The pellicle of claim 13, wherein the second metal layer is a Ru layer.

15. The pellicle of claim 7, wherein the base membrane is made of SiC.

16. The pellicle of claim 7, wherein the core layer is made of poly silicon.

17. A pellicle for an EUV photo mask, comprising:
a frame portion having an opening; and
a membrane disposed on the frame and consisting of three layers, wherein:
the three layers are:
a base membrane layer made of SiC;
a first metal layer disposed on the base membrane layer; and
a second metal layer disposed on the first metal layer,
wherein a thickness of the second metal layer is smaller than a thickness of the first metal layer.

18. The pellicle of claim 17, wherein the second metal layer is a Ru layer.

19. The pellicle of claim 18, wherein the first metal layer is a Mo layer.

20. The pellicle of claim 18, wherein the first metal layer is a Zr layer.

* * * * *